United States Patent
Beaudin et al.

(10) Patent No.: US 6,831,525 B1
(45) Date of Patent: Dec. 14, 2004

(54) OSCILLATOR ARRANGEMENTS WITH IMPROVED FREQUENCY STABILITY

(75) Inventors: Steve A. Beaudin, Ottawa (CA); Hongwei Xu, Ottawa (CA)

(73) Assignee: Nortel Networks Limited, St. Laurent (CN)

(*) Notice: Subject to any disclaimer, the term of this patent is extended or adjusted under 35 U.S.C. 154(b) by 0 days.

(21) Appl. No.: 10/320,451

(22) Filed: Dec. 17, 2002

(51) Int. Cl.$^7$ ................................. H03L 1/00
(52) U.S. Cl. .................. 331/176; 331/2; 331/46; 331/176; 331/158; 331/116 R; 327/105
(58) Field of Search ................ 331/107 A, 2, 331/46, 176, 158, 116 R; 327/105

(56) References Cited

U.S. PATENT DOCUMENTS 3,826,931 A * 7/1974 Hammond ............... 310/361
3,978,432 A    8/1976 Onoe ....................... 331/162
4,338,575 A    7/1982 Hartemann ............... 331/65

* cited by examiner

Primary Examiner—Arnold Kinkead

(57) ABSTRACT

Two oscillators produce respective signals at two different frequencies each dependent upon a parameter such as temperature in accordance with a polynomial with coefficients which are different for the two oscillators. A ratio of the frequencies is inverse to a ratio of a selected one of the coefficients of the polynomials. A mixer produces, at a sum or difference frequency of the two signals, an output signal for which a corresponding coefficient of a respective polynomial is substantially zero. The arrangement can be cascaded to produce zero coefficients for a plurality of terms in the polynomial.

17 Claims, 2 Drawing Sheets

OSCILLATOR ARRANGEMENTS WITH IMPROVED FREQUENCY STABILITY

This invention relates to oscillator arrangements, and is particularly concerned with providing an oscillator output signal with improved frequency stability.

BACKGROUND OF THE INVENTION

It is well known to provide an oscillator with a resonator in order to determine an oscillation frequency. The resonator may take any of various forms such as crystal, ceramic, dielectric, cavity, and coaxial cable resonators; for brevity herein only crystal oscillators are discussed below but the term "resonator" is used herein to include any of such devices or structures. A crystal resonator may use a rubidium or caesium crystal, or may use any of a variety of piezo-electric materials, such as quartz, employing any of a variety of types of acoustic waves, such as bulk, shallow bulk, and surface acoustic waves, in determining its resonant frequency. The term "crystal resonator" is used herein to include any such resonators, and in particular to include both bulk wave oscillators and surface acoustic wave (SAW) oscillators. The term "crystal oscillator" is used herein to mean an oscillator including a crystal resonator.

Crystal oscillators are frequently used to provide an oscillator output signal with a stable frequency. However, it is known that the output signal of a crystal oscillator has a frequency which is dependent upon various parameters such as temperature, acceleration, microphonics, and ageing. It is also known to compensate to some extent for changes of temperature by using a temperature-compensated crystal oscillator, or to reduce temperature changes by placing the crystal resonator and associated circuitry in a temperature-controlled oven.

In some applications a crystal oscillator is required to provide an extremely stable timing or frequency reference. For example, base stations of cellular wireless communications systems need a very accurate timing reference which they derive from GPS (global positioning system) satellites in normal operation, but in the absence of a GPS reference signal they are required to maintain the timing reference to an accuracy of about 7 $\mu$s in a 24-hour period. The frequency stability of the oscillator providing this reference must therefore be about 0.08 ppb (parts per billion).

For such frequency stability, sensitivity to acceleration is not significant because the crystal oscillator is stationary, microphonics can be avoided with good mechanical design, and ageing over the 24-hour period is very small, for example less than 0.02 ppb, so that temperature sensitivity is a dominant factor. A temperature compensated crystal oscillator may provide a frequency stability of only about 1 ppm (part per million), an ovenized crystal oscillator may provide a greater but still inadequate frequency stability, and a doubly ovenized crystal oscillator may still only provide a frequency stability of about 0.4 ppb; the steps of temperature compensation, ovenizing, and double ovenizing add considerable and successively increasing costs.

It is known from Onoe U.S. Pat. No. 3,978,432 issued Aug. 31, 1976 and entitled "Oscillator Having Plural Piezoelectric Vibrators Parallel Connected For Temperature Compensation" to provide an oscillator with two or more resonators connected in parallel, at least one of the resonators having a second-order frequency-temperature characteristic and the others each having a third-order frequency-temperature characteristic with resonant frequencies selected to provide a wider compensated temperature range for the oscillator. However, such an arrangement would be very difficult to provide in practice and does not provide frequency stability over an extended temperature range.

It is also known from Hartemann U.S. Pat. No. 4,338,575 issued Jul. 6, 1982 and entitled "Process For Compensating Temperature Variations In Surface Wave Devices And Pressure Transducer Utilizing This Process" to provide two SAW delay line oscillators with closely similar frequencies which are mixed to produce an output frequency that is a function of a parameter, such as force, pressure, or acceleration, to be measured, and to include in one of the oscillator loops an extra temperature-dependent delay for temperature compensation. In this arrangement the delay-temperature characteristic of the extra delay must precisely compensate for drift between the SAW delay lines with changing temperature; the reference assumes this to be linear, an assumption that is not necessarily valid. Further, the reference is concerned primarily with difference measurements for which an increase in output frequency is generally unimportant, and otherwise suggests additional measures. Such additional measures are not practicable to achieve the frequency stability as discussed above.

Accordingly, an improved oscillator arrangement is required to provide the desired frequency stability. Even where such extremely high frequency stability is not required, it is desirable to provide an oscillator arrangement with improved frequency stability, for example to reduce requirements for temperature compensation or ovenizing at any desired level of frequency stability.

SUMMARY OF THE INVENTION

According to one aspect, this invention provides an oscillator arrangement comprising: a first oscillator, comprising a resonator for determining a frequency of the oscillator, for producing a first signal at a frequency $f_1$ having a dependence upon a predetermined parameter P which includes a term $c_1 P_n$ where $c_1$ is a coefficient and n is a non-zero integer; a second oscillator, comprising a resonator for determining a frequency of the oscillator, for producing a second signal at a frequency $f_2$ having a dependence upon the predetermined parameter P which includes a term $c_2 P^n$ where $c_2$ is a coefficient not equal to $c_1$; and a mixer for combining the first and second signals to produce an output signal of the oscillator arrangement at a frequency $f_1 - f_2$; wherein $f_2 = (c_1/c_2) f_1$ whereby the output signal frequency has substantially zero dependence on $P^n$.

For example, the oscillators can comprise crystal oscillators the resonators of which comprise surface or bulk acoustic wave devices.

The first and/or second oscillator can include a frequency divider for producing the first and/or second signal, respectively, from an oscillation frequency of the oscillator determined by the resonator.

In particular, the predetermined parameter P can comprise temperature. For example, the resonators of the oscillators can be selected to have a predominantly linear dependence of frequency upon temperature, with n=1, or they can be selected to have a substantially zero first-order dependence of frequency upon temperature, with n=2, or they can be selected to have a predominantly third-order dependence of frequency upon temperature, with n=3.

A cascade of such oscillator arrangements can be provided in order to reduce temperature dependence for different powers of temperature, i.e. for a plurality of values of n. Thus the invention also provides an oscillator arrangement comprising a first oscillator arrangement as recited above for which the first and second oscillators comprise second and third, respectively, oscillator arrangements each as recited above, n having a first value for the first oscillator arrangement and a second value, different from the first value, for both of the second and third oscillator arrangements.

Such an oscillator arrangement can include one or more frequency dividers each for producing a signal frequency supplied to a respective mixer from a respective oscillator. The mixers and frequency dividers are conveniently constituted by a programmable digital circuit.

Another aspect of the invention provides an oscillator arrangement comprising two oscillators for producing respective signals at two different frequencies each of which has a respective dependence upon a parameter in accordance with a polynomial with respective coefficients which are different for the two oscillators, a product of one of the frequencies and a selected one of the coefficients of its polynomial being substantially equal to a product of the other frequency and a corresponding coefficient of its polynomial, and a mixer for producing a sum or difference frequency of the two signals for which a corresponding coefficient of a respective polynomial is substantially zero.

A further aspect of the invention provides a method of producing a signal at a desired frequency, comprising the steps of: producing two signals at respective frequencies using two oscillators, said respective frequencies being dependent upon temperature of the oscillators in accordance with respective polynomials having coefficients that are different for the respective frequencies, the respective frequencies having a frequency sum or difference equal to the desired frequency and a ratio which is inverse to a ratio of a selected one of the coefficients of the respective polynomials; and mixing said signals at the respective frequencies to produce the signal at the desired frequency with a dependence upon temperature in accordance with a polynomial for which the selected one of the coefficients is substantially zero.

BRIEF DESCRIPTION OF THE DRAWINGS

The invention will be further understood from the following description with reference to the accompanying drawings, in which the same reference numbers are used in different figures to refer to corresponding elements, and in which diagrammatically and by way of example.

DETAILED DESCRIPTION

The invention makes use of the recognition that the propagation velocity of an acoustic wave through or on a surface of a crystal resonator, and hence an oscillation frequency of a circuit comprising the resonator, can be represented by a polynomial, for example:

$$f = f_o(1 + \alpha T + \beta T^2 + \chi T^3 + \ldots + \epsilon A + \phi A^2)$$

where f is an actual oscillation frequency of the circuit at a temperature T and acceleration A, $f_o$ is a nominal oscillation frequency of the circuit, $\alpha, \beta, \chi, \ldots$ are first-, second-, third-, ... order temperature coefficients, and $\epsilon, \phi$ are first- and second-order acceleration coefficients of the polynomial, and the frequency depends only on temperature and acceleration. Further coefficients may be provided for higher orders of these parameters and for other parameters, and their powers, on which the frequency may depend. Each parameter may conveniently represent a difference rather than an absolute value; for example, T may represent a temperature difference from a particular value of temperature, or the value itself.

In the following description, it is assumed for simplicity that the acceleration A is substantially zero so that the last two terms in the above equation are also zero. It will be appreciated that this assumption need not be made, and that the same principles as described below can be applied for these or other terms in the polynomial. With this assumption, the polynomial becomes:

$$f = f_o(1 + \alpha T + \beta T^2 + \chi T^3 + \ldots)$$

which is a polynomial of order n for powers up to $T^n$; in this case n=3.

Embodiments of the invention use a plurality of oscillators, each with a respective resonator for which a respective oscillator frequency is determined in accordance with a respective polynomial, in a manner such that mixing of the resulting oscillator output signals produces a cancellation of the coefficients of a respective order, whereby a resulting signal has a frequency that is independent of this order of temperature variation. In general, n+1 oscillators, providing n+1 polynomials each with a respective set of different coefficients as indicated by the above equation, can be used for eliminating frequency dependence upon temperature variation up to order $T^n$. However, fewer oscillators may be used where the oscillator resonators inherently have an independence of frequency to temperature changes at a certain (e.g. first) order.

These principles are best described and understood by specific examples, and the following description is provided accordingly. However, it should be appreciated that this description is by way of example and illustration only, and that the invention is not limited in any way by these examples.

Figure 1:
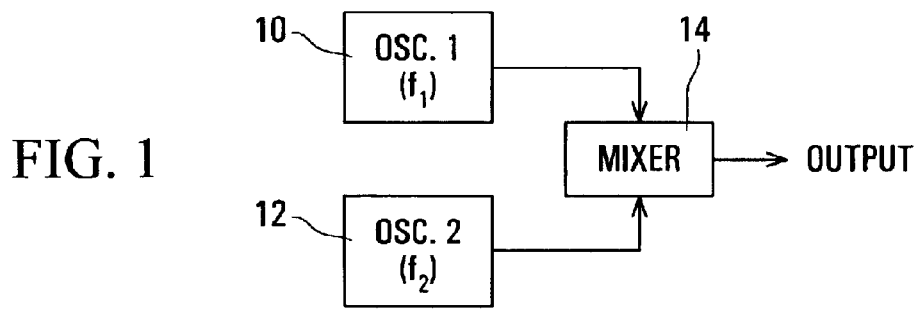
FIG. 1 illustrates an oscillator arrangement in accordance with an embodiment of the invention.

Referring to FIG. 1, an oscillator arrangement in accordance with an embodiment of the invention comprises two crystal oscillators 10 and 12 whose outputs are supplied to a mixer 14. The two crystal oscillators 10 and 12 have different temperature-frequency characteristics for example as further described below. The mixer 14 combines the output signals of the two oscillators to produce an output signal having increased frequency stability compared with the frequency stabilities of the two oscillators 10 and 12.

As a first example, the oscillator 10 may be selected to use a crystal resonator of 112° Y-cut lithium tantalate ($LiTaO_3$), whose frequency dependence upon temperature can be represented by a first polynomial $$\Delta f_1 / \Delta f_1 = \alpha_1 T + \beta_1 T^2 + \chi_1 T^3$$

where $\Delta f_1$ represents change of resonant frequency $f_1$ with temperature T, and $\alpha_1, \beta_1$, and $\chi_1$ are first-, second-, and third-order coefficients of temperature. For this crystal resonator the first-order coefficient at predominates and may be $-32 \cdot 10^{-6}$, i.e. $-32$ ppm, and the other coefficients $\beta_1$ and $\chi_1$ are relatively small.

In this example the oscillator 12 may be selected to use a crystal resonator of lithium niobate ($LiNbO_3$), whose frequency dependence upon temperature can be represented by a second polynomial $$\Delta f_2/f_2 = \alpha_2 T + \beta_2 T^2 + \chi_2 T^3$$

where $\Delta f_2$ represents change of resonant frequency $f_2$ with temperature T, and $\alpha_2$, $\beta_2$, and $\chi_2$ are first-, second-, and third-order coefficients of temperature. For this crystal resonator again the first-order coefficient $\alpha_2$ predominates and may be $-96.10^{-6}$, i.e. $-96$ ppm, and the other coefficients $\beta_2$ and $\chi_2$ are relatively small.

Omitting the relatively small higher-order terms, these polynomials can be expressed as $\Delta f_1 \approx \alpha_1 f_1 T$ and $\Delta f_2 \approx \alpha_2 f_2 T$, from which it can be seen that $$\Delta f_1 - \Delta f_2 \approx (\alpha_1 f_1 - \alpha_2 f_2) T.$$

In the oscillator arrangement of FIG. 1, the resonant frequencies $f_1$ and $f_2$ of the oscillators 10 and 12 are selected so that the term $(\alpha_1 f_1 - \alpha_2 f_2)$ is substantially zero, i.e. so that $\alpha_1 f_1 = \alpha_2 f_2$ and $f_2 = (\alpha_1/\alpha_2) f_1$. In other words, the frequencies $f_1$ and $f_2$ have a ratio which is inverse to the ratio of the coefficients $\alpha_1$ and $\alpha_2$. Consequently, the first-order dependence upon temperature of a difference signal at a frequency $f_1 - f_2$ produced by the mixer 14 as the output signal of the oscillator arrangement is substantially zero, and the higher-order dependence is small as discussed above, so that the frequency stability of the output of the oscillator arrangement is considerably improved (relative to that of either the oscillator 10 or the oscillator 12 alone) over a wide temperature range.

Figure 2:
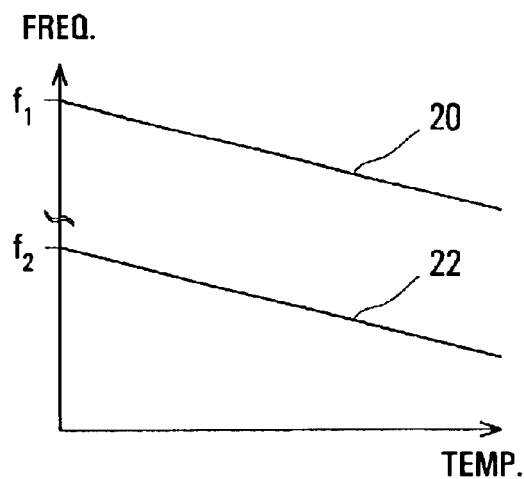
FIG. 2 shows a graph illustrating first-order frequency change with temperature of oscillators in the arrangement of FIG. 1.

FIG. 2 shows a graph illustrating this predominantly first-order dependence of frequency upon temperature of the oscillators 10 and 12 in the arrangement of FIG. 1. A line 20 represents a decrease of 32 ppm of the frequency $f_1$ of the oscillator 10 with increasing temperature. Similarly, a line 22 represents a decrease of 96 ppm of the frequency $f_2$ of the oscillator 12 with increasing temperature. The frequencies $f_2$ and $f_1$ are selected in the ratio $\alpha_1/\alpha_2$, in this case $-32/-96$ or $\frac{1}{3}$, so that the lines 20 and 22 are substantially parallel to one another, i.e. so that the difference $(\alpha_1 f_1 - \alpha_2 f_2)$ is substantially zero. These lines 20 and 22 are substantially straight in FIG. 2, because the second- and higher-order coefficients of the respective polynomials are small as discussed above. The frequencies $f_1$ and $f_2$ are further selected so that their difference $f_1 - f_2$ produced by the mixer 14 is a desired output frequency of the oscillator arrangement, this difference frequency having substantially zero first-order dependence upon temperature.

It can be appreciated that the oscillator arrangement can also include one or more filters for selecting only this difference frequency at the output of the mixer 14.

For example, with the coefficients given above, to provide an output signal at a frequency of 80 MHz the frequencies $f_1$ and $f_2$ of the oscillators 10 and 12 respectively may be selected as 120 MHz and 40 MHz respectively.

Although in the example given above the coefficients $\alpha_1$ and $\alpha_2$ are selected for providing a simple ratio, it will be appreciated that the same principles can be applied with coefficients having arbitrary values. In addition, it can be appreciated that although in the above example the coefficients $\alpha_1$ and $\alpha_2$ have the same (in this case negative) polarity, they may instead have opposite polarities, one being positive and the other negative.

In the latter case the frequencies $f_1$ and $f_2$ of the oscillators 10 and 12 are again selected so that the difference term $(\alpha_1 f_1 - \alpha_2 f_2)$ is substantially zero, i.e. so that $f_2 = (\alpha_1/\alpha_2) f_1$. However, in this case the opposite polarities of the coefficients result in a negative value for the frequency $f_2$. The magnitude of this negative value indicates the frequency $f_2$, and its negative sign indicates that it is added by the mixer 14 to the frequency $f_1$ instead of being subtracted from the frequency $f_1$ (in other words, the frequency magnitude $f_1 - f_2$ becomes $f_1 + f_2$ when the frequency $f_2$ has a negative sign). Thus in this case the mixer 14 is arranged to provide a sum frequency $f_1 + f_2$ as the output signal of the oscillator arrangement, in order again to provide substantially zero first-order dependence of the output signal frequency on temperature.

The same principles apply to the cancellation of second- or higher-order coefficients. By way of example, this is described below for second-order coefficients with reference to FIG. 3.

Figure 3:
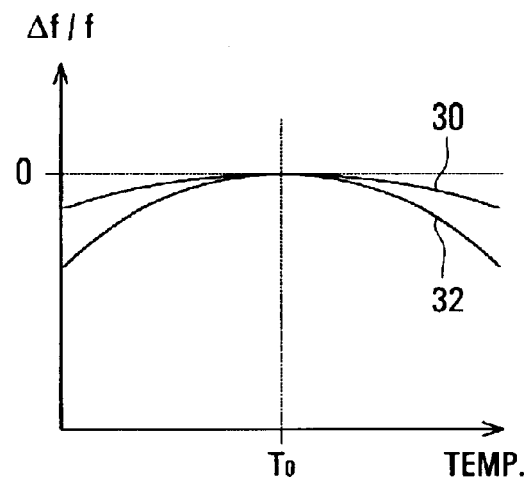
FIG. 3 shows a graph illustrating second-order frequency change with temperature of oscillators in the arrangement of FIG. 1.

Referring to FIG. 3, curved lines 30 and 32 represent, in a graph illustrating second-order relative frequency change $\Delta f/f$ with temperature, the parabolic nature of the temperature characteristics of oscillators 10 and 12 in the arrangement of FIG. 1 which are selected to have substantially zero first-order temperature coefficients $\alpha_1$ and $\alpha_2$, the resonators of the two oscillators being selected to have the same turn-over temperature $T_o$. Thus omitting third- and higher-order terms, the above polynomials for the oscillators 10 and 12 can in this case be expressed as $\Delta f_1 \approx \beta_1 f_1 (T - T_o)^2$ and $\Delta f_2 \approx \beta_2 f_2 (T - T_o)^2$. From these equations it can be seen that $$\Delta f_1 - \Delta f_2 \approx (\beta_1 f_1 - \beta_2 f_2)(T - T_o)^2.$$

For example, the oscillator 10 may be selected to use a crystal resonator of ST-cut quartz for which the first-order coefficient $\alpha_1$ is zero and the second-order coefficient $\beta_1$ is $-0.035 \cdot 10^{-6}$ or $-35$ ppb, and the oscillator 12 may be selected to use a crystal resonator of langasite ($La_3Ga_5SiO_{14}$) for which the first-order coefficient $\alpha_2$ is zero and the second-order coefficient $\beta_2$ is $-0.07 \cdot 10^{-6}$ or $-70$ ppb.

In a similar manner to that described above in relation to FIGS. 1 and 2, in this case the frequencies $f_2$ and $f_1$ are selected in the ratio $\beta_1/\beta_2$, in this case $-35/-70$ or $\frac{1}{2}$, so that the curves 30 and 32 are substantially identical in terms of absolute magnitude of frequency change with temperature (as distinct from the relative frequency change $\Delta f/f$ shown in FIG. 3), i.e. so that $\beta_1 f_1 = \beta_2 f_2$ and the difference $(\beta_1 f_1 - \beta_2 f_2)$ is substantially zero. The frequencies $f_1$ and $f_2$ are further selected so that their difference $f_1 - f_2$ produced by the mixer 14 is a desired output frequency of the oscillator arrangement. Again, it can be appreciated that the oscillator arrangement can also include one or more filters for selecting only this difference frequency at the output of the mixer 14. Because the first-order coefficients are zero and the second-order temperature dependence is cancelled in this manner, the output signal frequency produced by the mixer 14 has substantially zero first- and second-order dependence on temperature.

Again, although in this example the coefficients $\beta_1$ and $\beta_2$ are selected for providing a simple ratio, it will be appreciated that the same principles can be applied with coefficients having arbitrary values. In addition, it can be appreciated that although in the above example the coefficients $\beta_1$ and $\beta_2$ have the same (in this case negative) polarity, they may instead have opposite polarities, one being positive and the other negative. Again as discussed above in this case the frequencies $f_1$ and $f_2$ of the oscillators 10 and 12 are selected so that the difference term $(\beta_1 f_1 - \beta_2 f_2)$ is substantially zero, i.e. so that $f_2 = (\beta_1/\beta_2) f_1$, the negative result for the frequency $f_2$ again indicating that this frequency is added to the frequency $f_1$ by the mixer 14 to provide a sum frequency $f_1+f_2$ as the output signal of the oscillator arrangement, in order again to provide substantially zero first- and second-order dependence of the output signal frequency on temperature.

In the event that the two oscillators 10 and 12 do not have exactly the same turn-over temperature $T_o$ (for example, SAW devices may have a turn-over temperature tolerance of about ±1° C.), there is a small substantially linear (i.e. first-order) residual temperature dependence of frequency of the output signal produced by the mixer 14. It will be appreciated that this can also be reduced, in a similar manner to that described above with reference to FIGS. 1 and 2, by combining the techniques described herein as further described below.

From the above description, it will be appreciated that the frequencies $f_1$ and $f_2$ of the oscillators 10 and 12 have a ratio inverse to a ratio of the polynomial coefficients that are to be cancelled, and a difference corresponding to the desired frequency to be produced by the oscillator arrangement. The polynomial coefficients to be cancelled must be different from one another for the frequency difference to be non-zero, hence the use of different crystal resonators, and hence different polynomial coefficients, for the two oscillators. However, it is conceivable that the resonators of the two oscillators could be provided by a single crystal, for example using different acoustic wave propagation or oscillation modes, having different polynomials, to constitute the two resonators.

Figure 4:
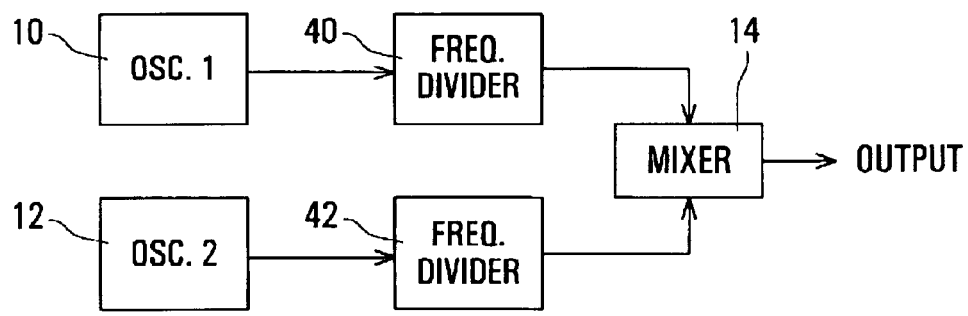
FIG. 4 illustrates an oscillator arrangement in accordance with another embodiment of the invention.

Each frequency supplied to the mixer 14 need not be the actual oscillator frequency, but alternatively can be derived from the respective oscillator frequency by a frequency divider (or a frequency multiplier, using a phase-locked loop). In this respect, FIG. 4 illustrates an oscillator arrangement in accordance with another embodiment of the invention, which is similar to that of FIG. 1 except in that the output of the oscillator 10 is divided in frequency, and supplied to the mixer 14, by a frequency divider 40, and the output of the oscillator 12 is divided in frequency, and supplied to the mixer 14, by a frequency divider 42.

Each of the frequency dividers 40 and 42 can have any desired frequency division (or multiplication) factor, including unity (the respective frequency divider may be omitted). Consequently, the oscillator arrangement of FIG. 4 constitutes a generalization of the oscillator arrangement of FIG. 1. The use of one or both of the frequency dividers 40 and 42 provides increased flexibility in selecting the frequencies of the oscillators 10 and 12, but does not otherwise change the principles of the invention described above for reducing temperature dependence of the output signal frequency of the oscillator arrangement.

The principles of the invention as described above can be extended to provide for simultaneous cancellation of a plurality of the polynomial coefficients, using an increased number of oscillators and mixers in a cascade arrangement. An example of this is illustrated by FIG. 5.

Figure 5:
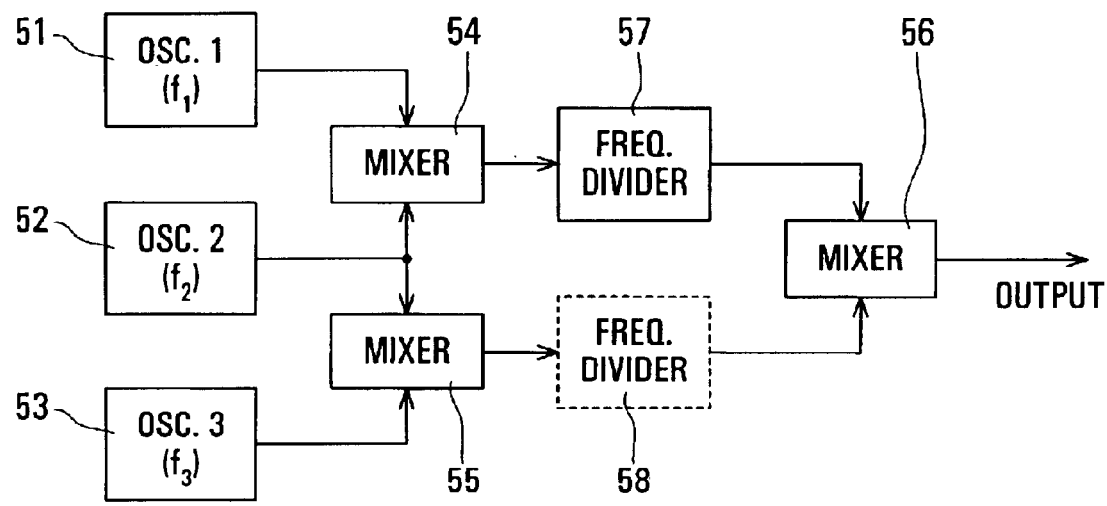
FIG. 5 illustrates an oscillator arrangement in accordance with a further embodiment of the invention.

The oscillator arrangement of FIG. 5 comprises three oscillators 51 to 53 with different polynomials as discussed above, three mixers 54 to 56, and frequency dividers (or multipliers) 57 and 58 each of which may be optional as shown by dashed lines for the frequency divider 58.

The oscillators 51 and 52 and the mixer 54 are arranged in the same manner as the components of FIG. 1. The oscillators 52 and 53 and the mixer 55 are also arranged in the same manner as the components of FIG. 1. Output signals of the mixers 54 and 55 are supplied via the frequency dividers 57 and 58 respectively to the mixer 56 which provides an output signal of the oscillator arrangement, in a similar manner to the arrangement of the frequency dividers 40 and 42 and the mixer 14 in the oscillator arrangement of FIG. 4.

By way of example, the oscillators 51 to 53 may use quartz resonators with different cuts, for example AT-cut, SC-cut, and BT-cut respectively, and hence different polynomials, each with a first-order temperature coefficient of substantially zero, to produce signals at respective oscillator frequencies $f_1$, $f_2$, and $f_3$. In the same manner as described above with reference to FIGS. 1 to 3, the frequencies $f_1$ and $f_2$ are selected in dependence upon the second-order coefficients of the polynomials for the oscillators 51 and 52 so that the mixer 54 produces a difference (or sum) frequency $f_4$ which has zero first- and second-order dependence of its output signal frequency on temperature. Similarly, the frequencies $f_2$ and $f_3$ are selected in dependence upon the second-order coefficients of the polynomials for the oscillators 52 and 53 so that the mixer 55 produces a difference (or sum) frequency $f_5$ which has zero first- and second-order dependence of its output signal frequency on temperature. The output signals of the mixers 54 and 55 can thus be represented by different polynomials of which the first- and second-order coefficients are substantially zero, and the third-order coefficient is predominant.

The frequencies $f_1$, $f_2$, and $f_3$ are also selected so that the resulting signal frequencies $f_4$ and $f_5$, as modified by the frequency division (or multiplication) factors of the frequency dividers 57 and 58 to the extent that these are provided, correspond to the ratio of the third-order coefficients of the resulting polynomials representing the temperature dependence of the signals at these frequencies, in a similar manner to that described above in relation to FIGS. 1 to 4 for signals provided directly by respective oscillators. Consequently, a difference (or sum) signal produced by the mixer 56 has substantially zero first-, second-, and third-order coefficients in its frequency-temperature polynomial.

Although specific crystal cuts are referred to above, it can be appreciated that other crystal cuts and other resonator materials may alternatively be used to provide similar results. In addition, although as shown in FIG. 5 the output of the oscillator 52 is supplied to both of the mixers 54 and 55, two separate oscillators could instead be used to supply separate signals to these two mixers.

Thus in the cascade arrangement of FIG. 5 an oscillator arrangement as shown in FIG. 1 is provided by the components 51, 52, and 54, another oscillator arrangement as shown in FIG. 1 is provided by the components 52, 53, and 55, and these oscillator arrangements constitute the oscillators of a further oscillator arrangement which also comprises the components 56 to 58.

It can be appreciated that the principles of FIGS. 1 to 5 can be further extended to provide for the cancellation of an arbitrary number and selection of polynomial coefficients, which may be temperature coefficients as described above and/or coefficients related to other parameters such as acceleration upon which frequency may be dependent. It can be appreciated from the above description that generally, in order to cancel a number n of polynomial coefficients (in addition to any coefficients that are already substantially zero), the oscillator arrangement will include at least n+1 oscillators, n(n+1)/2 mixers, and optional frequency changers as described above.

In embodiments of the invention the oscillators, mixers, and frequency changers (dividers or multipliers) may each take any desired form, and may for example be implemented using analog and/or digital techniques.

Figure 6:
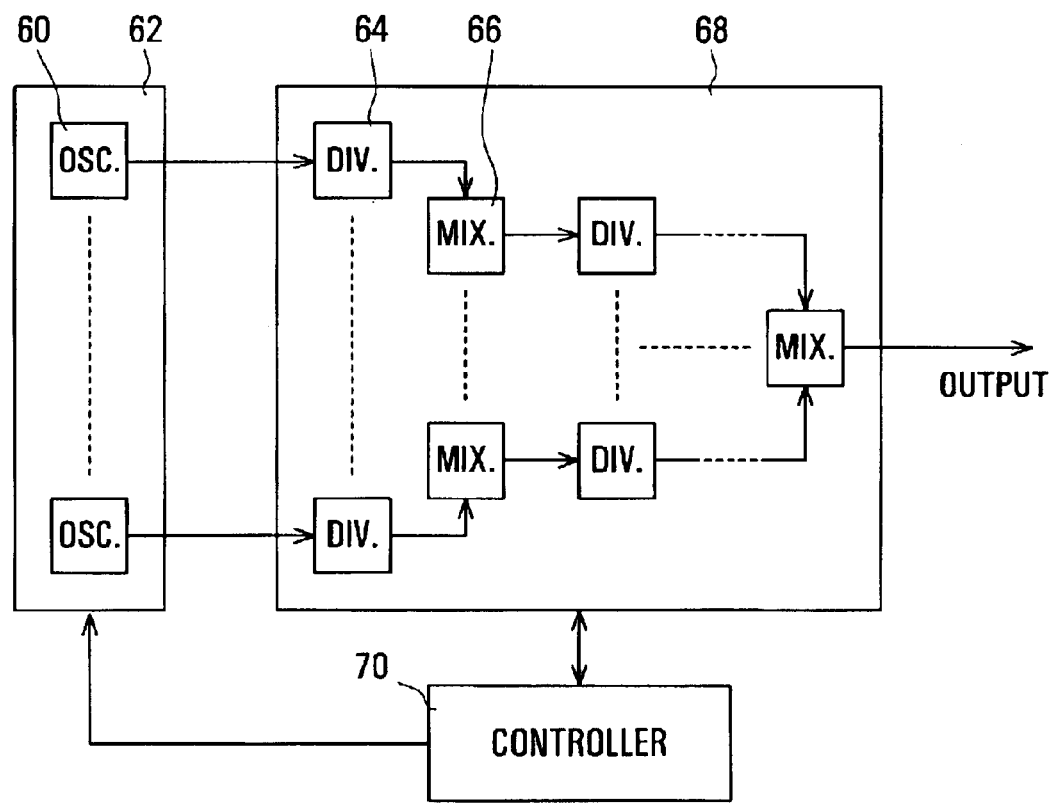
FIG. 6 illustrates an oscillator arrangement in accordance with yet another embodiment of the invention.

FIG. 6 illustrates an oscillator arrangement in accordance with another embodiment of the invention, which is particularly suitable for providing a highly temperature-stable output frequency using digital techniques.

Referring to FIG. 6, the oscillator arrangement comprises n (two or more) oscillators 60, having different polynomials as discussed above and provided in a temperature-controlled enclosure or oven 62, the outputs of which are supplied via optional frequency dividers 64 to mixers 66 which are arranged in the manner described above in relation to FIGS. 1 to 5, to provide an output signal for which at least one polynomial coefficient is cancelled in the manner described above. For example, the frequency dividers 64 and mixers 66 are provided by a digital circuit 68, such as an FPGA (field-programmable gate array). The oscillator arrangement further comprises a controller 70 which is coupled to the circuit 68 and serves to control the temperature of the oven 62.

In operation of the oscillator arrangement of FIG. 6, the controller initially characterises the temperature dependence of the oscillators 60, effectively to determine the coefficients of the respective polynomials for these oscillators, by controlling the oven 62 to sweep through a range of temperatures and by monitoring the output frequencies produced by the oscillators, at the inputs of, or at subsequent points within, the circuit 68. The controller 70 then programs the circuit 68 to implement a configuration of the dividers 64 and the mixers 66, in accordance with the principles of the invention as described above, to provide a desired cancellation of one or more of the polynomial coefficients, thereby to obtain a temperature-stable desired frequency of the signal produced at the output of the circuit 68, this stability being further enhanced by the controller 70 then maintaining a constant desired temperature of the oven 62.

It can be appreciated that an oscillator arrangement using the principles of the invention for example as described above can be used to provide a very temperature-stable reference frequency, from which one or more other, e.g. higher, frequencies can be provided with similar temperature stability by controlling their respective oscillators with a phase-locked loop (PLL) using this reference frequency.

It can also be appreciated that the principles of the invention for example as described above can also be used to provide an oscillator arrangement with a desired temperature-stable frequency for operation at a predetermined temperature for which standard crystal cuts are not optimized. For example, such an oscillator arrangement may be provided for operation at a low temperature, such as $-80°$ C. provided by a Peltier-effect cooler, at which ageing effects are reduced, the principles described above being used to reduce temperature dependence of the output frequency of the oscillator arrangement at this temperature. The same principles can be applied for any desired operating temperature.

Although embodiments of the invention are described above in the context of oscillators using crystal resonators and temperature dependence thereof, it can be appreciated that the invention is also applicable to other forms of resonator and to dependence of resonant frequency on other parameters, in which the dependence of the resonant frequency on the respective parameters can be represented by a polynomial expression whose coefficients are predetermined or can be determined or derived by measurements.

Thus although particular embodiments of the invention are illustrated by way of example and are described in detail above, it can be appreciated that numerous modifications, variations, and adaptations may be made within the scope of the invention as defined in the claims.

What is claimed is:

1. An oscillator arrangement comprising:
   a first oscillator, comprising a resonator for determining a frequency of the oscillator, for producing a first signal at a frequency $f_1$ having a dependence upon a predetermined parameter P which includes a term $c_1 P^n$ where $c_1$ is a coefficient and n is a non-zero integer;
   a second oscillator, comprising a resonator for determining a frequency of the oscillator, for producing a second signal at a frequency $f_2$ having a dependence upon the predetermined parameter P which includes a term $c_2 P^n$ where $c_2$ is a coefficient not equal to $c_1$; and
   a mixer for combining the first and second signals to produce an output signal of the oscillator arrangement at a frequent $f_1 - f_2$;
   wherein $f = c_1/c_2)f_1$ whereby the output signal frequency has substantially zero dependence on $P^n$, and the first and/or second oscillator includes a programmable digital circuit comprising a frequency divider or multiplier for producing the first and/or second signal, respectively, from an oscillation frequency of the oscillator determined by the resonator.

2. An oscillator arrangement as claimed 1 claim wherein the oscillators comprise crystal oscillators.

3. An oscillator arrangement as claimed in claim 2 wherein the resonator of at least one of the oscillators comprises a surface acoustic wave device.

4. An oscillator arrangement as claimed in claim 2 wherein the resonator of at least one of the oscillators comprises a bulk acoustic wave device.

5. An oscillator arrangement as claimed in claim 1 wherein the predetermined parameter P comprises temperature.

6. An oscillator arrangement as claimed in claim 5 wherein the resonators of the oscillators are selected to have a predominantly linear dependence of frequency upon temperature, and n=1.

7. An oscillator arrangement as claimed in claim 5 wherein the resonators of the oscillators are selected to have a substantially zero first-order dependence of frequency upon temperature, and n=2.

8. An oscillator arrangement as claimed in claim 5 wherein the resonators of the oscillators are selected to have a predominantly third-order dependence of frequency upon temperature, and n=3.

9. An oscillator arrangement comprising two crystal oscillators for producing respective signals at two different frequencies each of which has a respective dependence upon temperature in accordance with a polynomial with respective coefficients which are different for the two oscillators, a product of one of the frequencies and a selected one of the coefficients of its polynomial being substantially equal to a product of the other frequency and a corresponding coefficient of its polynomial, and a mixer for producing a sum or difference frequency of the two signals for which a corresponding coefficient of a respective polynomial is substantially zero, wherein at least one of the crystal oscillators includes a programmable digital circuit comprising a frequency divider or multiplier producing the respective signal from an oscillation frequency of the oscillator determined by a resonator.

10. A method of producing a signal at a desired frequency, comprising the steps of:
    producing two signals at respective frequencies using two oscillators and a programmable digital circuit comprising at least one frequency divider or multiplier arranged for dividing or multiplying a frequency of a respective oscillator, said respective frequencies being dependent upon temperature of the oscillators in accordance with respective polynomials having coefficients that are different for the respective frequencies, the respective frequencies having a frequency sum or difference equal to the desired frequency and a ratio which is inverse to a ratio of a selected one of the coefficients of the respective polynomials; and mixing said signals at the respective frequencies to produce the signal at the desired frequency with a dependence upon temperature in accordance with a polynomial for which the selected one of the coefficients is substantially zero.

11. A method as claimed in claim 10 and farther comprising the step of controlling a temperature of the two oscillators.

12. A method as claimed in claim 10 wherein the oscillators comprise crystal oscillators.

13. A method of producing a signal at a desired frequency, comprising the steps of:

producing signals at respective frequencies using at least three oscillators, said respective frequencies being dependent upon temperature of the oscillators in accordance with respective polynomials having coefficients that are different for the respective frequencies, at least two pairs of the respective frequencies each having a frequency ratio which is inverse to a ratio of a selected one of the coefficients of the respective polynomials;

mixing signals at the two pairs of respective frequencies to produce two sum or difference frequency signals each with a dependence upon temperature in accordance with a polynomial for which the selected one of the coefficients is substantially zero;

deriving from the two sum or difference frequency signals two signals having respective frequencies having a frequency sum or difference equal to the desired frequency and a ratio which is inverse to a ratio of another selected one of the coefficients of their respective polynomials; and mixing the derived signals to produce the signal at the desired frequency with a dependence upon temperature in accordance with a polynomial for which said another selected one of the coefficients is substantially zero;

Wherein the step of producing signals at respective frequencies using at least three oscillators comprises frequency dividing or multiplying at least one signal produced by one of the oscillators using a digitally programmed frequency divider or multiplier.

14. A method of producing a signal at a desired frequency comprising the steps of:

producing signals at respective frequencies using at least three oscillators, said respective frequencies being dependent upon temperature of the oscillators in accordance with respective polynomials having coefficients that a different for the respective frequencies, at least two pairs of the respective frequencies each having a frequency ratio which is inverse to a ratio of a selected one of the coefficients of the respective polynomials;

mixing signals at the two pairs of respective frequencies to produce two sum or difference frequency signals each with a dependence upon temperature in accordance with a polynomial for which the selected one of the coefficients substantially zero;

deriving from the two sum or difference frequency signals two signals having respective frequencies having a frequency sum or difference equal to the desired frequency and a ratio which is inverse to a ratio of another selected one of the coefficients of their respective polynomials; and mixing the derived signals to produce the signal at the desired frequency with a dependence upon temperature in accordance with a polynomial for which said another selected one of the coefficients is substantially zero;

wherein the step of deriving the two signals from the two am or difference frequency signals comprises frequency dividing or multiplying at least one of said sum or difference signal using a digitally programmed frequency divider or multiplier.

15. A method as claimed in claim 13 and further comprising a step of controlling a temperature of the at least three oscillators.

16. Apparatus for producing a signal at a desired frequency, comprising:

an oscillator arrangement including at least three oscillators for producing signals at respective frequencies, said respective frequencies being dependent upon temperature of the oscillators in accordance with respective polynomials having coefficients that are different for the respective frequencies, at least two pairs of the respective frequencies each having a frequency ratio which is inverse to a ratio of a selected one of the coefficients of the respective polynomials;

two mixers for mixing signals at the two pairs of respective frequencies to produce two sum or difference frequency signals each with a dependence upon temperature in accordance with a polynomial for which the selected one of the coefficients is substantially zero;

means for deriving from the two sun or difference frequency signals two signals having respective frequencies having a frequency sum or difference equal to the desired frequency and a ratio which is inverse to a ratio of another selected one of the coefficients of their respective polynomials; and a further mixer for mixing the derived signals to produce the signal at the desired frequency with a dependence upon temperature in accordance with a polynomial for which said another selected one of the coefficients is substantially zero;

wherein the apparatus includes a programmable digital circuit comprising at least one frequency divider or multiplier via which at least one signal is coupled to an input of at least one of the mixes.

17. Apparatus as claimed in claim 16 and further comprising means for controlling a temperature of the at least three oscillators.

* * * * *

UNITED STATES PATENT AND TRADEMARK OFFICE
CERTIFICATE OF CORRECTION

PATENT NO. : 6,831,525 B1
DATED : December 14, 2004
INVENTOR(S) : Beaudin et al.

It is certified that error appears in the above-identified patent and that said Letters Patent is hereby corrected as shown below:

<u>Column 12,</u>
Line 17, "am or difference" should read -- sum or difference --
Line 41, "the two sun" should read -- the two sum --
Line 55, "of the mixes." should read -- of the mixers. --

Signed and Sealed this

Fifth Day of April, 2005

JON W. DUDAS
*Director of the United States Patent and Trademark Office*